United States Patent
Hsieh et al.

(10) Patent No.: US 8,421,507 B2
(45) Date of Patent: Apr. 16, 2013

(54) PHASE-LOCKED LOOP WITH CALIBRATION FUNCTION AND ASSOCIATED CALIBRATION METHOD

(75) Inventors: Ming-Yu Hsieh, ChuPei (TW); Shih-Chieh Yen, ChuPei (TW)

(73) Assignee: MStar Semiconductor, Inc. (TW)

( * ) Notice: Subject to any disclaimer, the term of this patent is extended or adjusted under 35 U.S.C. 154(b) by 0 days.

(21) Appl. No.: 13/299,638

(22) Filed: Nov. 18, 2011

(65) Prior Publication Data

US 2012/0126866 A1    May 24, 2012

(30) Foreign Application Priority Data

Nov. 19, 2010  (TW) ............................ 99140096 A (51) Int. Cl.
*H03L 7/06* (2006.01)

(52) U.S. Cl.
USPC .......................................... 327/156; 327/147

(58) Field of Classification Search .................. 327/147, 327/156
See application file for complete search history.

(56) References Cited

U.S. PATENT DOCUMENTS

| | | | |
|---|---|---|---|
| 6,611,176 B1 * | 8/2003 | Goldman | 331/17 |
| 7,176,763 B2 * | 2/2007 | Park | 331/17 |
| 7,570,043 B2 * | 8/2009 | Goldman | 324/72.5 |
| 7,639,070 B2 * | 12/2009 | Goldman | 327/552 |
| 8,223,911 B2 * | 7/2012 | Ludwig | 375/376 |
| 2004/0061559 A1 * | 4/2004 | Charlon | 331/17 |
| 2005/0237120 A1 * | 10/2005 | Park | 331/16 |
| 2006/0214737 A1 * | 9/2006 | Brown et al. | 331/16 |
| 2007/0080751 A1 * | 4/2007 | Tu et al. | 331/16 |
| 2007/0109030 A1 * | 5/2007 | Park | 327/156 |
| 2010/0277244 A1 * | 11/2010 | Chang et al. | 331/16 |
| 2011/0099450 A1 * | 4/2011 | Chang et al. | 714/752 |
| 2011/0169501 A1 * | 7/2011 | Sato | 324/555 |
| 2012/0119801 A1 * | 5/2012 | Hsieh et al. | 327/156 |
| 2012/0126866 A1 * | 5/2012 | Hsieh et al. | 327/157 |
| 2012/0200327 A1 * | 8/2012 | Sreekiran et al. | 327/157 |
| 2012/0280730 A1 * | 11/2012 | Obkircher et al. | 327/157 |

* cited by examiner

*Primary Examiner* — Adam Houston
(74) *Attorney, Agent, or Firm* — Han IP Law PLLC (57) ABSTRACT

A phase-locked loop (PLL) includes a charge pump, a frequency divider, a voltage detector, a control module, and a calibration module. When a predetermined current amount and a predetermined frequency dividing amount are provided, the voltage detector measures a voltage associated with an output frequency of the PLL to generate a first reference voltage. When a test current amount and the predetermined frequency dividing amount are provided, the voltage detector again measures the voltage to generate a second reference voltage. When the predetermined current amount and a test frequency dividing amount are provided, the voltage detector again measures the voltage to generate a third reference voltage. The control module estimates a loop gain of the PLL according to the current amounts, the frequency dividing amounts and the reference voltages. The calibration module calibrates the PLL according to the loop gain.

12 Claims, 7 Drawing Sheets

PHASE-LOCKED LOOP WITH CALIBRATION FUNCTION AND ASSOCIATED CALIBRATION METHOD

This application claims the benefit of Taiwan application Serial No. 99140096, filed Nov. 19, 2010, the subject matter of which is incorporated herein by reference.

BACKGROUND OF THE INVENTION

1. Field of the Invention

The invention relates in general to a phase-locked loop (PLL) and more particularly to a method for calibrating a PLL.

2. Description of the Related Art

In current computer systems and communication systems, a phase-locked loop (PLL) providing oscillation signals of accurate frequencies plays a crucial role. Taking a wireless communication system for example, its transmission end often utilizes oscillation signals generated by a PLL as a reference for signal transmission. As a result, the quality of wireless signals is directly influenced by characteristics from a locking speed, a loop bandwidth to surge energy of the PLL.

Figure 1:
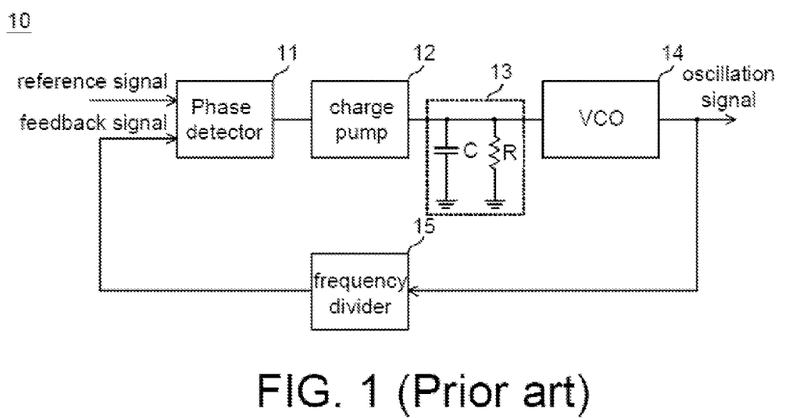
FIG. 1 is a structural diagram of a conventional type-I PLL.

FIG. 1 shows a structural diagram of a type-I phased-locked loop. A PLL 10 comprises a phase detector 11, a charge pump 12, a filter 13 consisted of a resistor R and a capacitor C, a voltage-controlled oscillator (VCO) 14, and a frequency divider 15. Since the resistor R forms a leakage path between an input end and a ground end of the VCO 14, the phase detector 11 is mandated to output cyclic pulses whether the PLL 10 is locked, so that the charge pump 12 charges the input end of the VCO 14 to compensate charge lost through the resistor R. When the PLL 10 is stabilized and a balance between charging and discharging is reached, a cycle of the pulses then equals a cycle of reference signals. However, the existence of the cyclic pulses imposes interference on oscillation signals at the output end of the VCO 14. As a phase difference between the reference signals and feedback signals grows larger, the pulses become wider and have greater energy. Consider circumstances that the oscillation signals have a frequency of 3.66 GHz, and the reference signals have a frequency of 26 MHz. In a spectrum of the output signals from the VCO 14, apart from a main component occurring at 3.66 GHz, so-called surges at 3.66 GHz±26 MHz are also present. Many wireless communication standards have specifications regarding upper limits of surge energy. A shortcoming of the type-I PLL is that the charging pulses usually result in excessively high surge energy.

Figure 2:
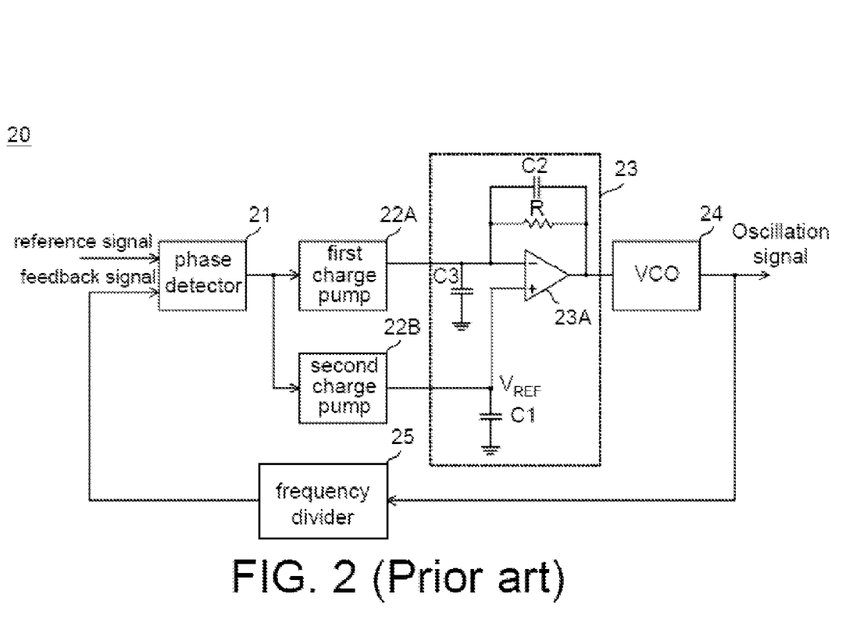
FIG. 2 is a structural diagram of a conventional type-II PLL.

FIG. 2 shows a structural diagram of a type-II PLL. A PLL 20 comprises a phase detector 21, two charge pumps 22A and 22B, an active filter 23 consisted of a resistor R, capacitors C1, C2 and C3, and an amplifier 23A, a VCO 24, and a frequency divider 25. As the PLL 20 becomes locked from unlocked, the second charge pump 22B charges/discharges the capacitor C1 in the active filter 23 according to a phase difference detected by the phase detector 21, until a reference voltage $V_{REF}$ indicated in the diagram is gradually pulled up/down to a control voltage appropriate for an input end of the VCO 24 when the PLL 20 is locked. Before the PLL 20 becomes locked, the reference voltage $V_{REF}$ and the control voltage usually need to go through a period of damping to be stabilized. This structure is free from the excessively high surge energy occurring in the type-I PLL, but yet a locking speed of the PLL 20 is directly restrained by a charge/discharge speed of the second charge pump 22B with respect to the capacitor C1. Further, the damping process also lengthens the locking speed of the PLL 20.

In addition, regardless the type of the abovementioned PLLs implemented, their parameters are shifted by a certain degree due to ambient variants from manufacture, temperature to voltage factors, such that many characteristics (e.g., bandwidth) do not match with predetermined values originally hoped to achieve at the time of designing the PLL.

SUMMARY OF THE INVENTION

The invention is directed to a PLL calibration method that determines an error of a loop gain through voltage changes when a test current amount and a test frequency dividing amount are provided.

According to an aspect of the present invention, a calibration method for a PLL is provided. The method comprises steps of: providing a predetermined current amount to a charge pump of the PLL and a predetermined frequency dividing amount to a frequency divider of the PLL, and measuring a voltage associated with an output frequency of the PLL to generate a first reference voltage; providing a test current to the charge pump, and measuring the voltage to generate a second reference voltage; providing a test frequency dividing amount to the frequency divider, and measuring the voltage to generate a third reference voltage, wherein the test frequency dividing value is a predetermined value; estimating a loop gain of the PLL according to the predetermined current amount, the predetermined frequency dividing amount, the test current amount, the test frequency dividing amount, the first reference voltage, the second reference voltage, the third reference voltage, and a reference frequency; and calibrating the PLL according to the loop gain.

The calibration method of the present invention may be applied to PLLs of different structures. The above and other aspects of the invention will become better understood with regard to the following detailed description of the preferred but non-limiting embodiments. The following description is made with reference to the accompanying drawings.

DETAILED DESCRIPTION OF THE INVENTION

Figure 3:
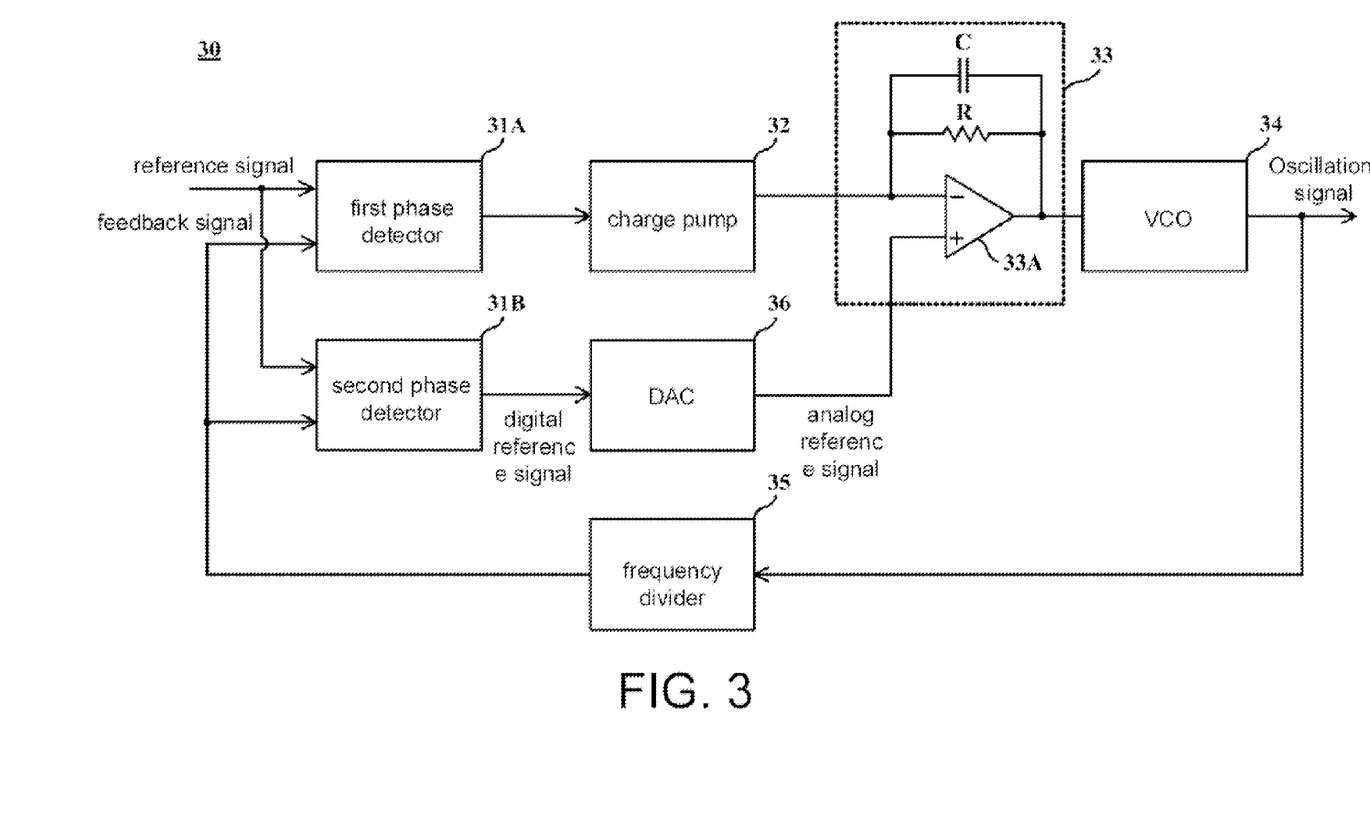
FIG. 3 is a block diagram of a PLL according to a first embodiment of the present invention.

FIG. 3 shows a schematic diagram of a PLL according to a first embodiment of the present invention. A PLL 30 comprises two phase detectors 31A and 31B, a charge pump 32, an active filter 33 consisted of a resistor R, a capacitor C and an operational amplifier 33A, a VCO 34, a frequency divider 35, and a digital-to-analog converter (DAC) 36.

As shown in FIG. 3, the active filter 33 comprises a first input end connected to the charge pump 32, a second input end connected to the DAC 36, and an output end for providing a control signal. The capacitor C and the resistor R are connected in parallel between the first input end and the output end. The VCO 34 generates an oscillation signal according to the control signal. The frequency divider 35 frequency divides the oscillation signal to generate a feedback signal. According to a reference signal inputted to the PLL 30 and the feedback signal, the first phase detector 31A generates a phase difference signal. The charge pump 32 provides a charge current to the first input end of the active filter 33 according to the phase difference signal.

The second phase detector 31B detects a positive/negative sign of the phase difference between the reference signal and the feedback signal, and outputs a digital reference signal. For example, the digital reference signal is an 8-bit binary signal generated by a digital accumulator (not shown) fed with differently valued multi-segment digital unit values. The positive/negative sign of the phase difference determines a positive/negative sign of the input signal to the accumulator, and a change speed of output values from the accumulator is dependent on the magnitude of the input signal to the accumulator. For example, when the phase of the reference signal is ahead of that of the feedback signal, the sign of the input signal to the accumulator is positive; conversely, when the phase of the reference signal is behind that of the feedback signal, the sign of the input signal to the accumulator is negative. The DAC 36 then converts the digital reference voltage to an analog reference voltage, and provides the analog reference voltage to the second input end of the active filter 33.

Figure 4:
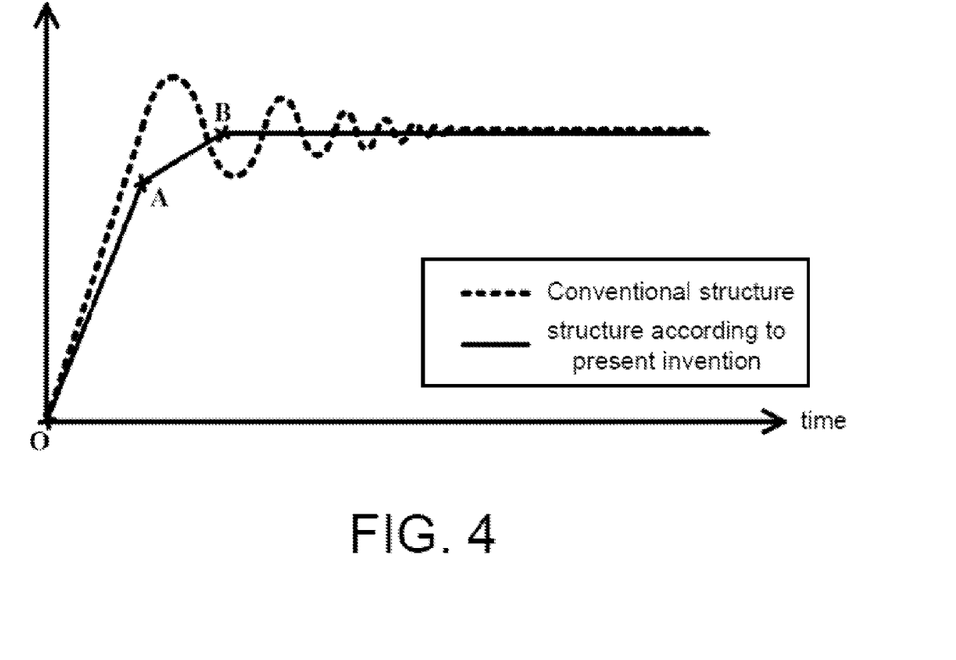
FIG. 4 is an example illustrating a comparison between voltages during a locking process of the present invention and the prior art.

Different from the type-II PLL, before the PLL 30 is locked, a digital charging path formed by the second phase detector 31B and the DAC 36 can be designed to directly provide a predetermined charge amount according to the positive/negative signal and magnitude of the phase difference. FIG. 4 shows an example illustrating a comparison between voltages during a locking process of the present invention and the prior art, where the horizontal axis represents time and the vertical axis represents a voltage value at the output end of the active filter 33 (i.e., the control voltage provided to the VCO 34). As observed from FIG. 4, the voltage value undergoes a period of damping before being stabilized when the conventional structure in FIG. 2 is implemented. In contrast, by implementing the structure of the present invention, the analog reference voltage provided by the DAC 36 quickly approximates a predetermined steady value, such that the voltage at the output end of the active filter 33 is quickly stabilized.

For example, within a segment O-A in FIG. 4, the input to the accumulator is set to a predetermined high unit value by the second phase detector 31B so that the voltage at the output end of the active filter 33 is quickly pulled up. After a predetermined period, the input to the accumulator is modified to another predetermined medium unit value so that the voltage at the output end of the active filter 33 slowly increases with a moderate slope to gradually approximate a locked state. Therefore, it is easily appreciated from FIG. 4 that the PLL 30 according to the embodiment of the invention becomes locked faster than the solution associated with the prior art. In other words, by appropriately controlling the reference voltage provided to the active filter 33, the time that the PLL 30 requires for becoming locked is effectively reduced by preventing damping. Depending on actual practice, the default output value of the accumulator may be programmable, such as set to ½ of the power supply voltage VDD of the PLL or any other default values through design. Supposing the voltage at the output end of the active filter 33 stabilizes to a target voltage value from VDD/2, the time required for locking is even reduced further since a voltage difference is decreased.

Figure 5:
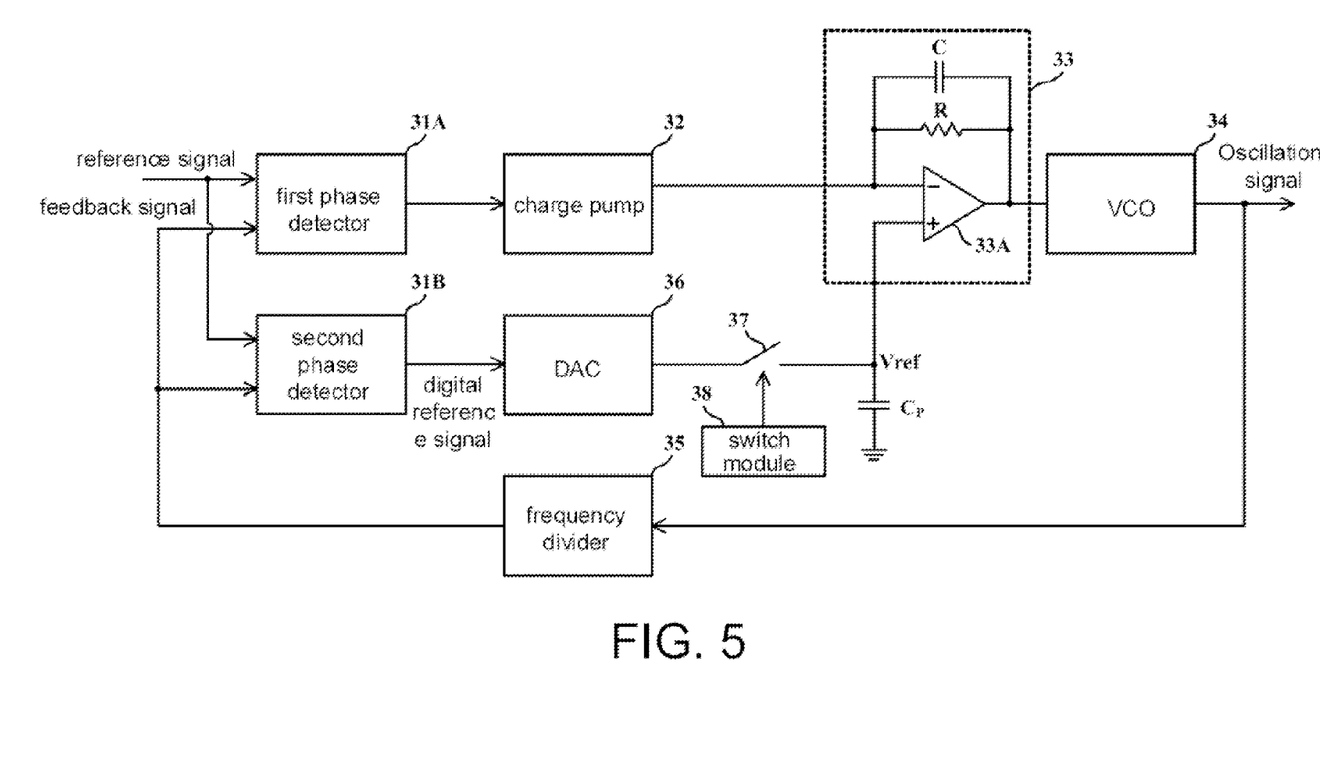
FIG. 5 is a block diagram of a PLL according to a second embodiment of the present invention.

FIG. 5 shows a block diagram according to a second embodiment of the present invention. Compared to first embodiment shown in FIG. 4, the PLL 30 in the second embodiment further comprises a capacitor $C_P$, a switch 37 and a switch module 38 in replacement of the above accumulator. The capacitor $C_P$ is coupled between the active filter 33 and the second input end, and the switch 37 is coupled between the second input end and the DAC 36. When the PLL 30 enters from an acquisition mode to a tracking mode, the switch module 38 controls the switch 37 to disconnect a link between the DAC 36 and the second input end.

When the switch 37 is open to couple the DAC 36 and the second input end, operations of the PLL 30 are in large similar to those of the one shown in FIG. 3, and the PLL 30 is equivalent to the type-II PLL shown in FIG. 2. When the switch 37 is controlled to open to disrupt the link between the DAC 36 and the second input end, in equivalence, the charge stored in the capacitor $C_P$ continues to provide the reference voltage needed by the active filter 33. When the link is disrupted, operations of the PLL 30 are equivalent to those of the type-I PLL.

The PLL in FIG. 5 contributes two major advantages. Compared to the conventional type-I PLL, the reference voltage needed by the filter is provided via the digital charging path when the PLL in FIG. 5 is under an acquisition mode, so that the time required for locking the PLL 30 is effectively shortened by preventing damping. The other advantage is that the PLL in FIG. 5 under a tracking mode operates as the type-I mode PLL, so that locking the control voltage of the VCO 34 is achieved without having to implement a high precision DAC 36 having a smallest bit count.

Figure 6A:
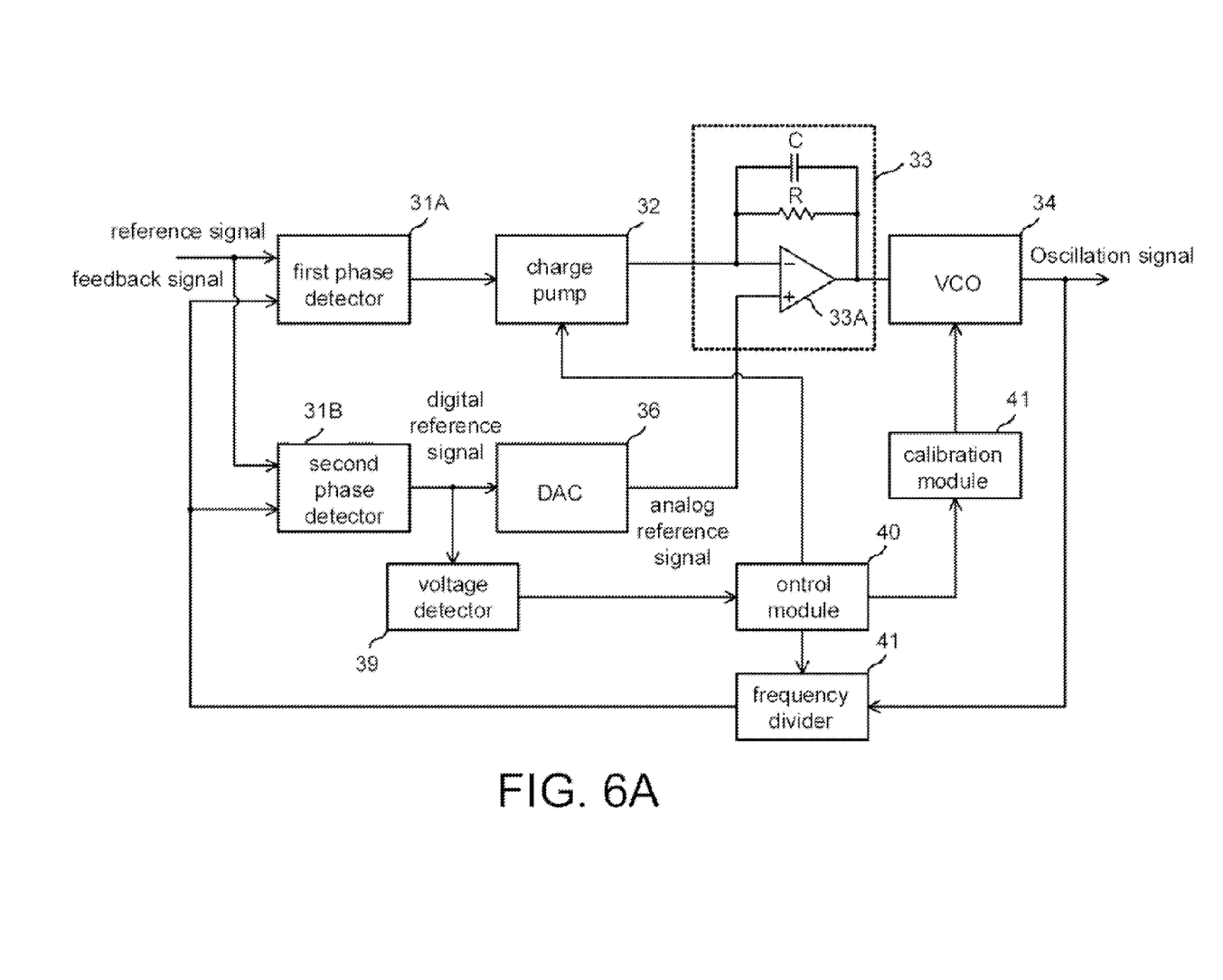
FIG. 6A is a block diagram of a PLL according to a third embodiment of the present invention.

A PLL having a calibration function is disclosed according to a third embodiment of the present invention. With reference to FIG. 6A, apart from the elements shown in FIG. 3, the PLL according to this embodiment further comprises a voltage detector 39, a control module 40 and a calibration module 41. In this embodiment, the charge pump 32 is designed as being capable of selectively providing a predetermined current $I_{norm}$ or a test current $I_{test}$, and the frequency divider 35 is designed as being capable of selectively providing a predetermined frequency dividing amount $N_{norm}$ or a predetermined test frequency dividing amount $N_{test}$. For example, the predetermined current $I_{norm}$ and the predetermined frequency dividing amount $N_{norm}$ are a current amount and a frequency dividing amount provided to the PLL during normal operations.

When the predetermined current amount $I_{norm}$ and the predetermined frequency dividing amount $N_{norm}$ are provided, a loop gain $G_{loop}$ of the PLL is represented as:

$$G_{loop} = \frac{I_{norm} \times R \times K_{VCO}}{N_{norm}} \quad \text{Formula (1)}$$

Wherein, R represents a resistance value in the active filter 33, $K_{VCO}$ represents a voltage-frequency conversion coefficient of the VCO 34. R and $K_{VCO}$ are usually shifted by a certain degree due to ambient variants from manufacture, temperature to voltage factors, such that many characteristics (e.g., bandwidth) do not match with predetermined ideal values originally hoped to achieve at the time of designing the PLL. The calibration function of the invention is thus targeted at determining a shifted amount of the loop gain $G_{loop}$, based on which the PLL or other peripheral circuits associated with the PLL are calibrated.

To determine the shifted amount of the loop gain $G_{loop}$, the control module 40 first controls the charge pump 32 to provide the predetermined current amount $I_{norm}$ and the frequency divider 35 to provide the predetermined frequency dividing amount $N_{norm}$. When the PLL is locked, the voltage detector 39 measures a voltage associated with the output frequency of the oscillation signal to generate a first reference voltage $V_1$. In this embodiment, the value measured by voltage detector 39 is the digital reference voltage provided by the second phase detector 31B. In practice, the measured value by the voltage detector 39 can also be the analog reference voltage outputted by the DAC 36, or the control voltage provided by the active filter 33 to the VCO 34. Compared to measuring an analog voltage, measuring a digital voltage is relatively convenient and fast.

The control module 40 then controls the charge pump 32 to provide the test current amount $I_{test}$ and controls the frequency divider 35 to continue in providing the predetermined frequency dividing amount $N_{norm}$. When the PLL is almost locked, the voltage detector 39 again measures the digital reference voltage to generate a second reference voltage $V_2$. Since the test current amount $I_{test}$ is different from the predetermined current amount $I_{norm}$, the second reference voltage $V_2$ is accordingly different from the previously obtained first reference voltage $V_1$ such that the frequency of the oscillation signal outputted from the VCO 34 is changed. Compared to the frequency of the oscillation signal when the digital reference signal is the first reference voltage $V_1$, the frequency difference $\Delta f_1$ resulted by such condition is represented as:

$$\Delta f_1 = \Delta V_1 \times K_{VCO} = \Delta I \times R \times K_{VCO} \quad \text{Formula (2)}$$

Wherein, $\Delta I$ represents a difference between the predetermined current amount $I_{norm}$ and the test current amount $I_{test}$, and $\Delta V_1$ represents a difference between the first reference voltage $V_1$ and the second reference voltage $V_2$.

In the next step, the control module 40 controls the charge pump 32 to provide the predetermined current amount $I_{norm}$ and the frequency divider 35 to provide the test frequency dividing amount $N_{test}$. When the PLL is almost locked, the voltage detector 39 again measures the digital reference voltage to generate a third reference voltage $V_3$. Since the test frequency dividing amount $N_{test}$ is different from the predetermined frequency dividing amount $N_{norm}$, the third reference voltage $V_3$ is accordingly different from the previously obtained first reference voltage $V_1$ such that the frequency of the oscillation signal outputted from the VCO 34 is changed. Compared to the frequency of the oscillation signal when the digital reference signal is the first reference voltage $V_1$, the frequency difference $\Delta f_2$ resulted by such condition is represented as:

$$\Delta f_2 = \Delta V_2 \times K_{VCO} = \Delta N \times F_{ref} \quad \text{Formula (3)}$$

Wherein, $\Delta N$ represents a difference between the predetermined frequency dividing amount $N_{norm}$ and the test frequency dividing amount $N_{test}$, $\Delta V_2$ represents a difference between the first reference voltage $V_1$ and the third reference voltage $V_3$, and $F_{ref}$ represents a reference frequency (i.e., a frequency of the reference signal inputted to the PLL).

By dividing Formula (2) by Formula (3):

$$\frac{\Delta f_1}{\Delta f_2} = \frac{\Delta V_1}{\Delta V_2} = \frac{\Delta I \times R \times K_{VCO}}{\Delta N \times F_{ref}} \quad \text{Formula (4)}$$

From Formula (4), it is derived that:

$$R \times K_{VCO} = \frac{\Delta N}{\Delta I} \times \frac{\Delta V_1}{\Delta V_2} \times F_{ref} \quad \text{Formula (5)}$$

By combining Formulae (5) and (1), the loop gain $G_{loop}$ of the PLL is represented as:

$$G_{loop} = \frac{I_{norm}}{N_{norm}} \times R \times K_{VCO} = \frac{I_{norm}}{N_{norm}} \times \frac{\Delta N}{\Delta I} \times \frac{\Delta V_1}{\Delta I} \times F_{ref} \quad \text{Formula (6)}$$

It is observed from Formula (6) that, even with shift amounts of R and $K_{VCO}$ being unknown values, the control module 40 is still able to estimate the loop gain $G_{loop}$ of the PLL according to the predetermined current amount $I_{norm}$, the predetermined frequency dividing amount $N_{norm}$, the test current amount $I_{test}$, the test frequency dividing amount $N_{test}$, the first reference voltage $V_1$, the second reference voltage $V_2$, the third reference voltage $V_3$, and the reference frequency $F_{ref}$. Further, the control module 40 is capable of determining a difference between the current loop gain $G_{loop}$ and the ideal loop gain $G_{loop}$ originally designed (i.e., the loop gain $G_{loop}$ when R and $K_{VCO}$ are not shifted).

The calibration module 41 calibrates the PLL according to the loop gain $G_{loop}$ estimated by the control module 40. In this embodiment, the calibration module 41 calibrates the VCO 34 according to the difference between the above loop gain $G_{loop}$ and the ideal value. In practice, the calibration may also calibrate a filter element (e.g., the resistor R or the capacitor C) in the active filter 33.

Figure 6B:
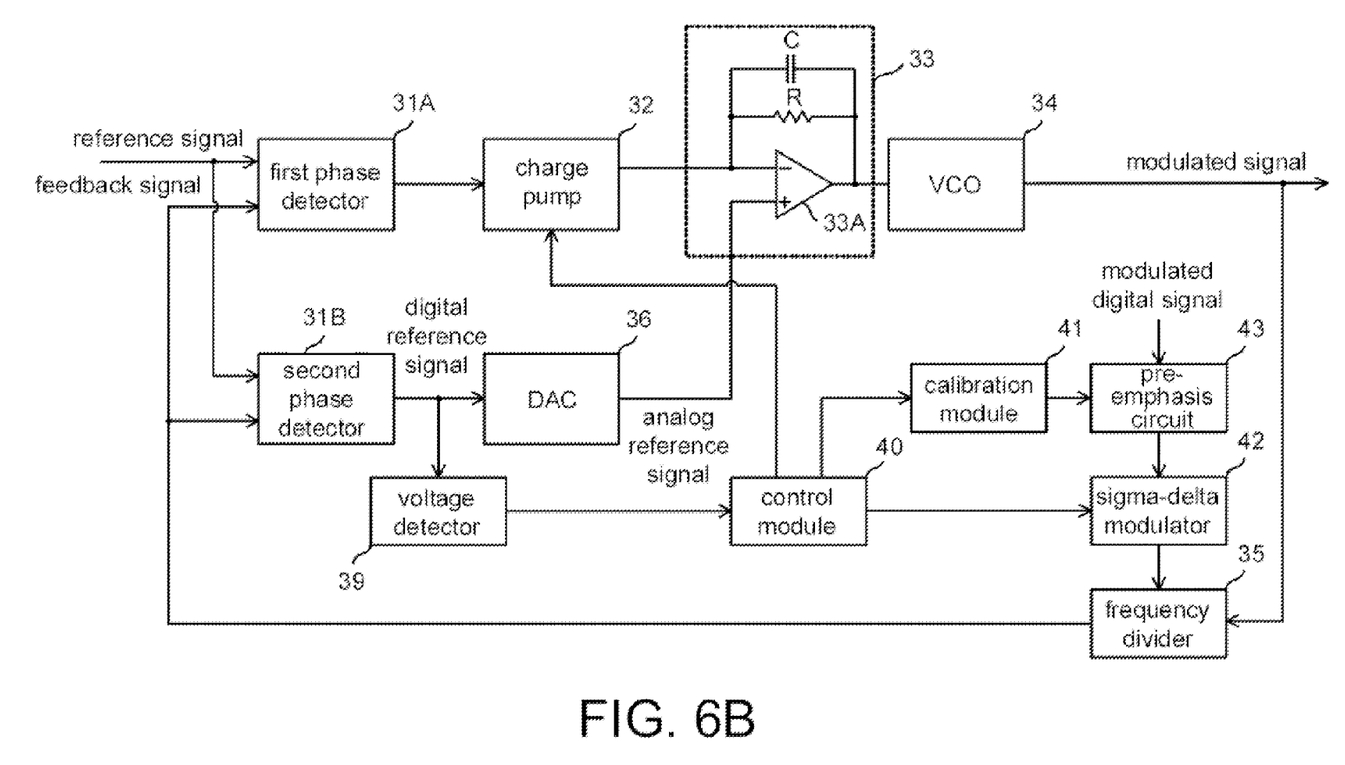
FIG. 6B is a block diagram of a PLL according to a fourth embodiment of the present invention.

FIG. 6B shows a block diagram of a PLL according to a fourth embodiment of the present invention. A main difference between this embodiment and the third embodiment is that, in this embodiment, between the control module 40 and the frequency divider is connected with a sigma-delta ($\Sigma\Delta$) modulator 42 for modulating the test frequency amount so that the frequency amount difference $\Delta N$ can be a non-integer. Further, when the PLL is applied to a digital modulation transmitter, the calibration module 41 may be targeted to modulate a pre-emphasis circuit 43. The pre-emphasis circuit 43 is for providing a high-pass filter effect to compensate attenuation in modulated signals resulted from low-pass filter characteristics of the PLL.

In practice, the design of the pre-emphasis circuit 43 is associated with the loop gain $G_{loop}$. Therefore, when the loop gain $G_{loop}$ is shifted, it is possible that parameters in the pre-emphasis circuit 43 be correspondingly adjusted. The calibration module 41 is this embodiment also calibrates the pre-emphasis circuit 43 according to the loop gain $G_{loop}$ estimated by the control module 40. It is to be understood that the loop gain $G_{loop}$ estimated by the control module 40 can also be applied to peripheral circuits of the PLL instead of being limited to applications of main functional blocks of the PLL.

Further, the calibration method described above may be applied to various circuits of charge pumps and frequency dividers, and are not limited by the examples illustrated by FIGS. 6A and 6B.

A calibration method for a PLL is provided according to a fifth embodiment of the present invention. The PLL comprises a charge pump and a frequency divider. The calibration method comprises steps shown in FIG. 7. In Step S71, a predetermined current amount $I_{norm}$ is provided at the charge pump, and a predetermined frequency dividing a $N_{norm}$ is provided at the frequency divider. In Step S72, when the PLL is locked, a voltage associated with an output frequency of the PLL is measured to generate a first reference voltage $V_1$. In Step S73, a test current amount $I_{test}$ is provided at the charge pump, and the predetermined frequency dividing amount $N_{norm}$ is provided at the frequency divider. In Step S74, when the PLL is locked, the voltage is again measured to generate a second reference voltage $V_2$.

Figure 7:
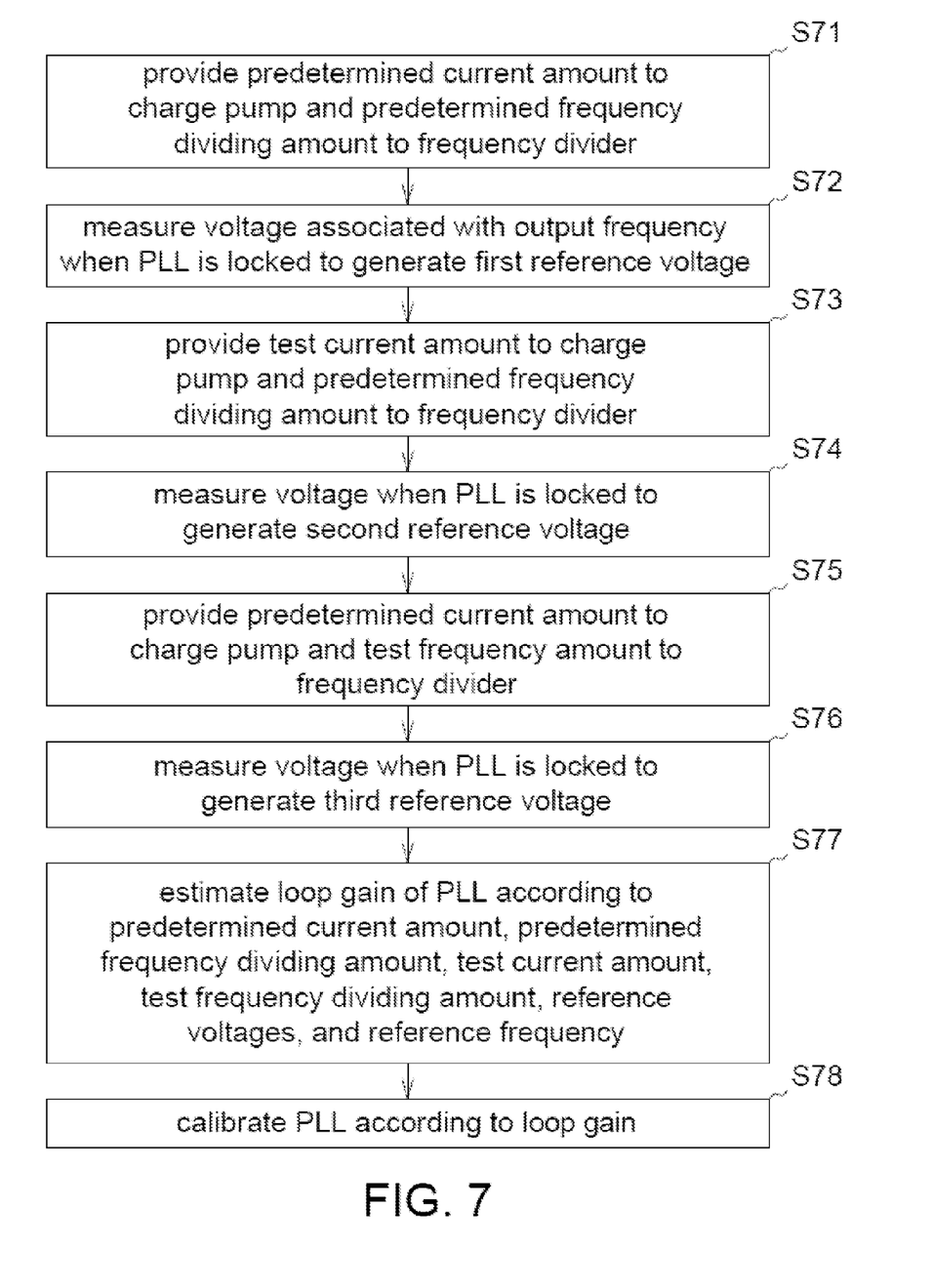
FIG. 7 is a flowchart of a calibration method for a PLL according to a fifth embodiment of the present invention.

In Step S75, the predetermined current amount $I_{norm}$ provided at is provided the charge pump, and a test frequency dividing amount $N_{test}$ is provided at the frequency divider, wherein the test frequency dividing amount $N_{test}$ is a predetermined value. In Step S76, when the PLL is locked, the voltage is again measured to generate a third reference voltage $V_3$. In Step S77, a loop gain $G_{loop}$ of the PLL is estimated according to the predetermined current amount $I_{norm}$, the predetermined frequency dividing amount $N_{norm}$, the test current amount $I_{test}$, the test frequency dividing amount $N_{test}$, the first reference voltage $V_1$, the second reference voltage $V_2$, the third reference voltage $V_3$, and a reference frequency $F_{ref}$. In Step S78, the PLL is calibrated according to the loop gain $G_{loop}$.

Details of estimation of the loop gain $G_{loop}$ and calibration of the PLL are same as those described in the previous embodiment, and shall be omitted for brevity. It is to be noted that, Steps S73 to S74 and Steps S75 to S76 may be exchanged; further, the calibration method may be applied to PLLs of different structures rather than the examples shown in FIGS. 6A and 6B.

With the embodiments, it is easily appreciated that the PLL of the present invention replaces an analog charging path consisted of a charge pump and a capacitor in the prior art with a digital charging path. The digital charging path of the present invention may be designed to directly provide a predetermined charge amount according to a positive/negative signal of a phase difference, so as to steadily pull-up a reference voltage provided to an active filter and to effectively reduce time needed for locking the PLL by preventing damping. Compared to the prior art, the present invention contributes advantages of having a fast locking speed and low surge energy.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A calibration method for a phase-locked loop (PLL) that comprises a charge pump and a frequency divider, the method comprising:

measuring a voltage associated with an output frequency of the PLL to generate a first reference voltage by providing a predetermined current amount at the charge pump and providing a predetermined frequency dividing amount at the frequency divider;

measuring the voltage to generate a second reference voltage by providing a test current amount at the charge pump and providing the predetermined frequency dividing amount at the frequency divider;

measuring the voltage to generate a third reference voltage by providing the predetermined current amount at the charge pump and providing a test frequency dividing amount at the frequency divider, wherein the test frequency dividing value is a predetermined value;

estimating a loop gain of the PLL according to the predetermined current amount, the predetermined frequency dividing amount, the test current amount, the test frequency dividing amount, the first reference voltage, the second reference voltage, the third reference voltage, and a reference frequency; and calibrating the PLL according to the loop gain.

2. The method according to claim 1, wherein the loop gain $G_{loop}$ is represented as:

$$G_{loop} = \frac{I_{norm}}{N_{norm}} \times \frac{\Delta N}{\Delta I} \times \frac{\Delta V_1}{\Delta V_2} \times F_{ref},$$

where $I_{norm}$ represents the predetermined current amount, $N_{norm}$ represents the predetermined frequency dividing amount, $I_{test}$ represents the test current amount, $N_{est}$ represents the test frequency dividing amount, $\Delta N$ represents a difference between the predetermined frequency dividing amount $N_{norm}$ and the test frequency dividing amount $N_{est}$, $\Delta I$ represents a difference between the predetermined current amount $I_{norm}$ and the test current amount $I_{test}$, $V_1$ represents the first reference voltage, $V_2$ represents the second reference voltage, $V_3$ represents the third reference voltage, $\Delta V_1$ represents a difference between the first reference voltage $V_1$ and the second reference voltage $V_2$, $\Delta V_2$ represents a difference between the first reference voltage $V_1$ and the third reference voltage $V_3$, and $F_{ref}$ represents the reference frequency.

3. The method according to claim 1, wherein the PLL further comprises an active filter, a phase detector and a digital-to-analog converter (DAC), wherein the phase detector generates a digital reference signal according to a phase difference between a reference signal and a feedback signal, wherein the DAC converts the digital reference signal to an analog reference signal provided to the active filter, and wherein the measured voltage is the digital reference voltage.

4. The method according to claim 1, wherein the PLL further comprises a filter element and a voltage-controlled oscillator (VCO), and wherein the calibrating step calibrates the filter element or the VCO according to the loop gain.

5. The method according to claim 1, wherein the PLL further comprises a pre-emphasis circuit, and wherein the calibrating step calibrates the pre-emphasis circuit according to the loop gain.

6. The method according to claim 1, wherein the test frequency dividing amount comprises a test frequency dividing amount processed by signal-delta modulation.

7. A phase-locked loop (PLL), comprising:
a charge pump that provides a predetermined current amount or a test current amount;
a frequency divider that provides a predetermined frequency dividing amount or a test frequency dividing amount, the test frequency dividing amount being a predetermined value;
a voltage-controlled oscillator (VCO) that (a) measures a voltage associated with an output frequency of the PLL when the charge pump provides the predetermine current amount and the frequency divider provides the predetermined frequency dividing amount to generate a first reference voltage, (b) measures the voltage when the charge pump provides the test current amount and the frequency divider provides the predetermined frequency dividing amount to generate a second reference voltage, and (c) measures the voltage when the charge pump provides the predetermined current amount and the frequency divider provides the test frequency dividing amount to generate a third reference voltage;

a control module that estimates a loop gain of the PLL according to the predetermine current amount, the predetermined frequency dividing amount, the test current amount, the test frequency dividing amount, the first reference voltage, the second reference voltage, the third reference voltage, and a reference frequency; and a calibration module that calibrates the PLL according to the loop gain.

8. The PLL according to claim 7, wherein the loop gain $G_{loop}$ is represented as:

$$G_{loop} = \frac{I_{norm}}{N_{norm}} \times \frac{\Delta N}{\Delta I} \times \frac{\Delta V_1}{\Delta V_2} \times F_{ref},$$

where $I_{norm}$ represents the predetermined current amount, $N_{norm}$ represents the predetermined frequency dividing amount, $I_{test}$ represents the test current amount, $N_{est}$ represents the test frequency dividing amount, $\Delta N$ represents a difference between the predetermined frequency dividing amount $N_{norm}$ and the test frequency dividing amount $N_{est}$, $\Delta I$ represents a difference between the predetermined current amount $I_{norm}$ and the test current amount $I_{test}$, $V_1$ represents the first reference voltage, $V_2$ represents the second reference voltage, $V_3$ represents the third reference voltage, $\Delta V_1$ represents a difference between the first reference voltage $V_1$ and the second reference voltage $V_2$, $\Delta V_2$ represents a difference between the first reference voltage $V_1$ and the third reference voltage $V_3$, and $F_{ref}$ represents the reference frequency.

9. The PLL according to claim 7, further comprising:
an active filter;
a phase detector that generates a digital reference voltage according to a phase difference between a reference signal and a feedback signal; and
a digital-to-analog converter (DAC) that converts the digital reference signal to an analog reference signal provided to the active filter, the voltage measured by the voltage detector being the digital reference voltage.

10. The PLL according to claim 7, further comprising a filter element, wherein the calibration module calibrates the filter element or the VCO according to the loop gain.

11. The PLL according to claim 7, further comprising a pre-emphasis circuit, wherein the calibration module calibrates the pre-emphasis circuit according to the loop gain.

12. The PLL according to claim 7, further comprising a sigma-delta modulator that modulates the test frequency dividing amount.

* * * * *